United States Patent
Ryu et al.

(10) Patent No.: US 12,312,688 B2
(45) Date of Patent: *May 27, 2025

(54) PRECURSORS AND RELATED METHODS

(71) Applicant: ENTEGRIS, INC., Billerica, MA (US)

(72) Inventors: MinSeok Ryu, Namdong-gu (KR);
  SangJin Lee, Suwon-si (KR);
  SeongCheol Kim, Suwon-si (KR);
  YeRim Yeon, Suwon-si (KR); YoonHae Kim, Suwon-si (KR); KieJin Park, Gwacheon-si (KR)

(73) Assignee: ENTEGRIS, INC., Billerica, MA (US)

( * ) Notice: Subject to any disclaimer, the term of this patent is extended or adjusted under 35 U.S.C. 154(b) by 59 days.

This patent is subject to a terminal disclaimer.

(21) Appl. No.: 18/082,215

(22) Filed: Dec. 15, 2022

(65) Prior Publication Data

US 2023/0193462 A1    Jun. 22, 2023

Related U.S. Application Data

(60) Provisional application No. 63/291,119, filed on Dec. 17, 2021.

(51) Int. Cl.
  *C07F 7/10*   (2006.01)
  *C23C 16/455*   (2006.01)
  *C23C 16/513*   (2006.01)

(52) U.S. Cl.
  CPC .......... *C23C 16/45553* (2013.01); *C07F 7/10* (2013.01); *C23C 16/513* (2013.01)

(58) Field of Classification Search
  USPC .......................................................... 528/10
  See application file for complete search history.

(56) References Cited

U.S. PATENT DOCUMENTS

| 2013/0295779 A1 | 11/2013 | Chandra et al. |
| 2015/0004317 A1 | 1/2015 | Dussarrat et al. |
| 2020/0055881 A1 | 2/2020 | Rossle et al. |

FOREIGN PATENT DOCUMENTS

| JP | H0899979 | * | 4/1996 |
| JP | 2011089186 A | | 5/2011 |
| WO | 2020101437 A1 | | 5/2020 |
| WO | 2020160529 A1 | | 8/2020 |

OTHER PUBLICATIONS

JPH0899979 Machine Translation (Year: 1996).*

* cited by examiner

*Primary Examiner* — Terressa Boykin (57) ABSTRACT

Some embodiments relate to a precursor comprising a precursor for vapor deposition. The precursor comprises an aliphatic hydrocarbon and at least one disilylamine group. The at least one disilylamine group is attached to the aliphatic hydrocarbon. The at least one disilylamine group does not comprise a silanide group. Some embodiments relate to a method for making the precursor. The method comprises reacting a polyamine compound and a silylhalide compound in a presence of a base to form a precursor useful for vapor deposition. Some embodiments relate to a method for forming a silicon-containing film using the precursor.

17 Claims, 3 Drawing Sheets

PRECURSORS AND RELATED METHODS

PRIORITY

This disclosure claims priority to U.S. provisional patent No. 63/291,119 with a filing date of Dec. 17, 2021, which is incorporated by reference herein.

FIELD

This disclosure generally relates to precursors for vapor deposition and related methods.

BACKGROUND

Semiconductor device fabrication process utilize silicon source reagents in vapor deposition processes to form silicon films. One example of a silicon source reagent is tetraethylorthosilicate (TEOS). To form a silicon film from TEOS, the TEOS is vaporized and deposited on a substrate.

SUMMARY

Some embodiments relate to a precursor. In some embodiments, the precursor comprises an aliphatic hydrocarbon and at least one disilylamine group. In some embodiments, the at least one disilylamine group is attached to the aliphatic hydrocarbon. In some embodiments, the at least one disilylamine group does not comprise a silanide group.

In some embodiments, the aliphatic hydrocarbon comprises a $C_1$-$C_{10}$ alkane.

In some embodiments, the aliphatic hydrocarbon comprises a linear $C_1$-$C_{10}$ alkane.

In some embodiments, the aliphatic hydrocarbon comprises a branched $C_1$-$C_{10}$ alkane.

In some embodiments, the at least one disilylamine group has the following chemical formula:

where:
$R^1$, $R^2$, and $R^3$ independently comprise a hydrogen, a $C_1$-$C_{10}$ linear alkyl, a $C_3$-$C_{10}$ branched alkyl, a $C_3$-$C_8$ cycloalkyl, an aryl, or a benzyl.

In some embodiments, the precursor further comprises at least one silylamine group attached to the aliphatic hydrocarbon.

In some embodiments, the at least one silylamine group has the following chemical formula:

where:
$R^1$, $R^2$, and $R^3$ independently comprise a hydrogen, a $C_1$-$C_{10}$ linear alkyl, a $C_3$-$C_{10}$ branched alkyl, a $C_3$-$C_8$ cycloalkyl, an aryl, or a benzyl.

In some embodiments, the precursor is a compound of the formula:

or where:
n is 0 to 10; and
$R^1$, $R^2$, and $R^3$ independently comprise a hydrogen, a $C_1$-$C_{10}$ linear alkyl, a $C_3$-$C_{10}$ branched alkyl, a $C_3$-$C_8$ cycloalkyl, an aryl, or a benzyl.

In some embodiments, the precursor is a reaction product of a polyamine compound and a silylhalide compound.

In some embodiments, the precursor is a compound of the formula:

or

In some embodiments, the precursor is a liquid at room temperature.

Some embodiments relate to a method for forming a silicon-containing film. In some embodiments, the method for forming a silicon-containing film comprises one or more of the following steps: obtaining a precursor comprising an aliphatic hydrocarbon and at least one disilylamine group, wherein the at least one disilylamine group is attached to the aliphatic hydrocarbon and wherein the at least one disilylamine group does not comprise a silanide group; vaporizing the precursor to obtain a vaporized precursor; and contacting the vaporized precursor with a substrate, under vapor deposition conditions, to form a silicon-containing film on the substrate.

In some embodiments, the vapor deposition conditions comprise atomic layer deposition conditions.

In some embodiments, the vapor deposition conditions comprise plasma-enhanced atomic layer deposition conditions.

In some embodiments, the vapor deposition conditions comprise thermal atomic layer deposition conditions.

In some embodiments, the silicon-containing film comprises at least one of SiO, SiN, SiOC, SiCN, SiOCN, or any combination thereof.

In some embodiments, the precursor is a compound of the formula:

where:
n is 0 to 10; and
$R^1$, $R^2$, and $R^3$ independently comprise a hydrogen, a $C_1$-$C_{10}$ linear alkyl, a $C_3$-$C_{10}$ branched alkyl, a $C_3$-$C_8$ cycloalkyl, an aryl, or a benzyl.

In some embodiments, the precursor is a compound of the formula:

where:
n is 0 to 10; and
$R^1$, $R^2$, and $R^3$ independently comprise a hydrogen, a $C_1$-$C_{10}$ linear alkyl, a $C_3$-$C_{10}$ branched alkyl, a $C_3$-$C_8$ cycloalkyl, an aryl, or a benzyl.

In some embodiments, the precursor is a compound of the formula:

or

Some embodiments relate to a method for making a precursor. In some embodiments, the method for making the precursor comprises one or more of the following steps: reacting a polyamine compound and a silylhalide compound, in a presence of a base, to form a precursor comprising an aliphatic hydrocarbon and at least one disilylamine group, wherein the at least one disilylamine group is attached to the aliphatic hydrocarbon and wherein the at least one disilylamine group does not comprise a silanide group.

BRIEF DESCRIPTION OF THE DRAWINGS

Reference is made to the drawings that form a part of this disclosure, and which illustrate embodiments in which the materials and methods described herein can be practiced.

DETAILED DESCRIPTION

Definitions

As used herein, the term "aliphatic hydrocarbon" refers to a monovalent or polyvalent aliphatic hydrocarbon radical. The term includes, for example and without limitation, at least one of monovalent alkyl radicals, polyvalent alkyl radicals, monovalent alkenyl radicals, polyvalent alkenyl radicals, monovalent alkynyl radicals, polyvalent alkynyl radicals, or any combination thereof. The term polyvalent includes, for example and without limitation, at least one of divalent radicals, trivalent radicals, tetravalent radicals, or any combination thereof, among other multivalent radicals. Non-limiting examples of aliphatic hydrocarbons include at least one of a monovalent alkyl radical, a divalent alkyl radical, a trivalent alkyl radical, or a tetravalent alkyl radical. In some embodiments, the aliphatic hydrocarbon does not comprise a heteroatom. In some embodiments, the aliphatic hydrocarbon does not comprise any cyclic compound, such as, for example and without limitation, a cycloalkane.

As used herein, the term "alkyl" refers to a monovalent or polyvalent hydrocarbon chain radical having from 1 to 30 carbon atoms. An alkyl having n carbon atoms may be designated as a "$C_n$ alkyl." For example, a "$C_3$ alkyl" may include n-propyl and isopropyl. An alkyl having a range of carbon atoms, such as 1 to 30 carbon atoms, may be designated as a $C_1$-$C_{30}$ alkyl. In some embodiments, the alkyl is linear. In some embodiments, the alkyl is branched. In some embodiments, the alkyl is substituted. In some embodiments, the alkyl is unsubstituted. In some embodiments, the alkyl comprises, consists of, or consists essentially of, or is selected from the group consisting of, at least one of a $C_1$-$C_{10}$ alkyl, a $C_1$-$C_9$ alkyl, a $C_1$-$C_8$ alkyl, a $C_1$-$C_7$ alkyl, a $C_1$-$C_6$ alkyl, a $C_1$-$C_5$ alkyl, a $C_1$-$C_4$ alkyl, a $C_1$-$C_3$ alkyl, a $C_2$-$C_{10}$ alkyl, a $C_3$-$C_{10}$ alkyl, a $C_4$-$C_{10}$ alkyl, a $C_5$-$C_{10}$ alkyl, a $C_6$-$C_{10}$ alkyl, a $C_7$-$C_{10}$ alkyl, a $C_8$-$C_{10}$ alkyl, a $C_2$-$C_9$ alkyl, a $C_2$-$C_8$ alkyl, a $C_2$-$C_7$ alkyl, a $C_2$-$C_6$ alkyl, a $C_2$-$C_5$ alkyl, a $C_3$-$C_5$ alkyl, or any combination thereof. In some embodiments, the alkyl comprises, consists of, or consists essentially of, or is selected from the group consisting of, at least one of methyl, ethyl, n-propyl, 1-methylethyl (iso-propyl), n-butyl, iso-butyl, sec-butyl, n-pentyl, 1,1-dimethylethyl (t-butyl), n-pentyl, iso-pentyl, n-hexyl, isohexyl, 3-methylhexyl, 2-methylhexyl, heptyl, octyl, nonyl, decyl, dodecyl, octadecyl, or any combination thereof.

As used herein, the term "cycloalkyl" refers to a non-aromatic carbocyclic ring radical attached via a single bond and having from 3 to 8 carbon atoms in the ring. The term includes a monocyclic non-aromatic carbocyclic ring and a polycyclic non-aromatic carbocyclic ring. For example, two or more cycloalkyls may be fused, bridged, or fused and bridged to obtain the polycyclic non-aromatic carbocyclic ring. In some embodiments, the cycloalkyl comprises, consists of, or consists essentially of, or is selected from the group consisting of, at least one of cyclopropyl, cyclobutyl, cyclopentyl, cyclohexyl, cycloheptyl, cyclooctyl, or any combination thereof.

As used herein, the term "aryl" refers to an aromatic ring comprising carbon and hydrogen atoms. Examples of aryls include, without limitation, phenyl, biphenyl, napthyl, and the like.

As used herein, the term "growth per cycle" or "GPC" refers to the incremental increase in thickness of a film per cycle of deposition.

As used herein, the term "silicon-containing film" refers to a film comprising at least one of silicon, silicon nitride, silicon oxynitride, silicon oxide, silicon dioxide, silicon carbide, silicon carbonitride, silicon oxycarbonitride, carbon-doped silicon nitride, carbon-doped silicon oxide, carbon-doped silicon oxynitride, or any combination thereof. For example, the silicon-containing film may comprise at least one of a SiO film, a SiN film, a SiOC film, a SiCN film, a SiOCN film, or any combination thereof. In some embodiments, the silicon-containing film has a thickness of 20 Å to 2000 Å.

DISCUSSION

Some embodiments relate to precursors and related methods. At least some of these embodiments relate to precursors useful in the fabrication of microelectronic devices, including semiconductor devices, and the like. For example, the precursors can be used to form silicon-containing films by one or more deposition processes. Examples of deposition processes include, without limitation, at least one of a chemical vapor deposition (CVD) process, a digital or pulsed chemical vapor deposition process, a plasma-enhanced cyclical chemical vapor deposition process (PECCVD), a flowable chemical vapor deposition process (FCVD), an atomic layer deposition (ALD) process, a thermal atomic layer deposition, a plasma-enhanced atomic layer deposition (PEALD) process, a metal organic chemical vapor deposition (MOCVD) process, a plasma-enhanced chemical vapor deposition (PECVD) process, or any combination thereof.

In some embodiments, for example, silicon precursors are provided. The silicon precursors may exhibit numerous advantages over conventional silicon precursors. For example, the precursors may exhibit at least one of high growth per cycle (GPC), high thermal stability, or any combination thereof. At least one advantage of the precursors is that the high GPC in deposition processes, such as atomic layer deposition, increases as the number of silyl groups attached to the nitrogen of amine increases. At least another advantage is that the strength of the silicon-nitrogen bonds of the silylamine groups and/or disilylamine groups imparts high thermal stability to the silicon precursors, while the amine group increases silicon reactivity. In addition, the precursors may be provided in the form of liquids (e.g., as liquid silicon precursors). These advantages shall not be limiting as numerous other advantages are described herein or otherwise apparent from this disclosure.

The precursor may comprise, consist of, or consist essentially of at least one of an aliphatic hydrocarbon, at least one silylamine group, at least one disilylamine group, or any combination thereof. In some embodiments, the precursor comprises, consists of, or consists essentially of an aliphatic hydrocarbon attached to at least one disilylamine group. The number of disilylamine groups attached to the aliphatic hydrocarbon is not particularly limited. For example, one to twenty disilylamine groups may be attached to the aliphatic hydrocarbon. In some embodiments, the aliphatic hydrocarbon is attached or further attached to at least one silylamine group. The number of silylamine groups attached to the aliphatic hydrocarbon is not particularly limited. For example, one to twenty silylamine groups may be attached or further attached to the aliphatic hydrocarbon. In some embodiments, the at least one silylamine group and/or the at least one disilylamine group is/are a terminal group(s) in which a nitrogen atom(s) is/are bonded to a terminal carbon atom(s) of the aliphatic hydrocarbon.

In some embodiments, the disilylamine group is represented by the following chemical formula:

wherein each of $R^1$, $R^2$, and $R^3$ independently comprises a hydrogen, a $C_1$-$C_{10}$ linear alkyl, a $C_3$-$C_{10}$ branched alkyl, a $C_3$-$C_8$ cycloalkyl, an aryl, a benzyl, or any combination thereof.

In some embodiments, the silylamine group is represented by the following chemical formula:

wherein each of $R^1$, $R^2$, and $R^3$ independently comprises a hydrogen, a $C_1$-$C_{10}$ linear alkyl, a $C_3$-$C_{10}$ branched alkyl, a $C_3$-$C_8$ cycloalkyl, an aryl, a benzyl, or any combination thereof.

In some embodiments, the precursor comprises, consists of, or consists essentially of a compound of the formula:

or where:
n is 0 to 10;
$R^1$, $R^2$, and $R^3$ each independently comprise a hydrogen, a $C_1$-$C_{10}$ linear alkyl, a $C_3$-$C_{10}$ branched alkyl, a $C_3$-$C_8$ cycloalkyl, an aryl, a benzyl, or any combination thereof.

In some embodiments, the precursor is a reaction product of an amine compound and a silyl halide compound.

In some embodiments, the amine compound is a primary amine, a secondary amine, or a tertiary amine. In some embodiments, the amine compound is at least one of a diamine, a triamine, a tetraamine, a pentaamine, etc., or any combination thereof. In some embodiments, the amine compound is a polyamine compound. In some embodiments, the polyamine compound comprises, consists of, or consists essentially of, or is selected from the group consisting of, at least one of ethylenediamine, propylenediamine, trimethylenediamine, triethylenediamine, methylpentanediamine, tetramethylenediamine, 1,3-diaminobutane, 2,3-diaminobutane, pentamethylenediamine, 2,4-diaminopentane, hexamethylenediamine, heptamethylenediamine, octamethylenediamine, nonamethylenediamine, 1,2,3-triaminopropane, hydrazine, tetra(aminomethyl)methane, or any combination thereof. In some embodiments, the polyamine compound comprises, consists of, consists essentially of, or is selected from the group consisting of, at least one of N-methylethylenediamine, N,N-dimethylethylenediamine, trimethylethylenediamine, N-ethylethylenediamine, N,N-diethylethylenediamine, triethylethylenediamine, or any combination thereof. In some embodiments, the polyamine compound comprises, consists of, consists essentially of, or is selected from the group consisting of, at least one of tris(2-aminoethyl)amine, diethylenetriamine, triethylenetetramine, tetraethylenepentamine, heptaethyleneoctamine, nonaethylenedecamine, N',N'-bis(2-aminoethyl)ethane-1,2-diamine, or any combination thereof. In some embodiments, the polyamine compound comprises at least one of 1,2-ethane diamine; 1,2-propane diamine; 1,3-propane diamine; 1,4-butane diamine; 1,6-hexane diamine; 2-methyl-1,5-pentane diamine; 2,2(4),4-trimethylhexanediamine; 2,2,4-trimethyl-1,6-hexanediamine; 2,4,4-trimethyl-1,6-hexanediamine; or any combination thereof.

In some embodiments, the silyl halide compound is a compound of the formula:

where:
X is a halogen (e.g., F, Cl, Br, or I); and
$R^1$, $R^2$, and $R^3$ each independently comprise a hydrogen, a $C_1$-$C_{10}$ linear alkyl, a $C_3$-$C_{10}$ branched alkyl, a $C_3$-$C_8$ cycloalkyl, an aryl, or a benzyl.

In some embodiments, the silylhalide compound comprises, consists of, consists essentially of, or is selected from the group consisting of, at least one of a dialkylsilylhalide, a trialkylsilylhalide, a monoalkyldiarylsilylhalide, a triarylsilylhalide, or any combination thereof. In some embodiments, the silylhalide compound comprises, consists of, consists essentially of, or is selected from the group consisting of, at least one of dichlorosilane, trichlorosilane, triethylsilylchloride, tert-butyldimethylsilyl chloride, trimethylsilane, trimethylchlorosilane, tetramethylsilylchloride, triphenylsilylchloride, tert-butyldiphenylsilylchloride, or any combination thereof.

In some embodiments, the precursor is a compound of at least one of the following formulas:

The precursor may have a purity level of 95% or greater. For example, in some embodiments, precursor has a purity level of 95% to 100%, 96% to 100%, 97% to 100%, 98% to 100%, 99% to 100%, 99.9% to 100%, 99.99% to 100%, 99.999% to 100%, or 99.9999% to 100%.

Figure 1:
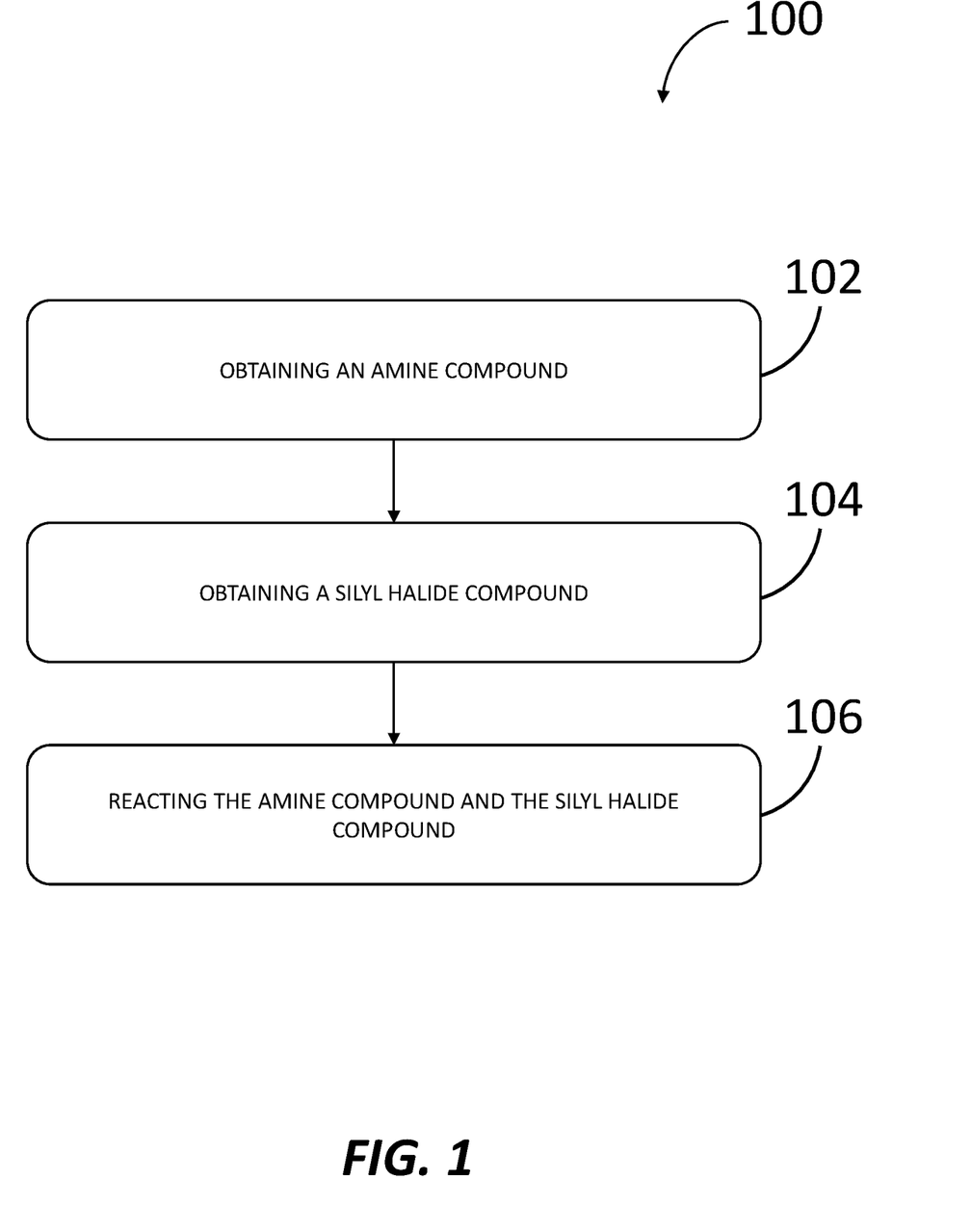
FIG. 1 is a flowchart of a method for making a precursor, according to some embodiments.

FIG. 1 is a flowchart of a method for making a precursor, according to some embodiments. As shown in FIG. 1, the method for making the precursor may comprise, consist of, or consist essentially one or more of the following steps: obtaining 102 an amine compound, obtaining 104 a silyl halide compound, and reacting 106 the amine compound and the silyl halide compound to obtain a precursor. In some embodiments, the reaction proceeds by contacting the amine compound and the silyl halide compound in a presence of a base. In some embodiments, the reaction proceeds by contacting the amine compound and the silyl halide compound in a solvent containing a base.

The amine compound may comprise, consist of, or consist essentially of a compound comprising one or more amine groups. In some embodiments, the amine compound comprises a plurality of amine groups. For example, the amine compound may be a polyamine compound. In some embodiments, the polyamine compound comprises, consists of, or consists essentially of, or is selected from the group consisting of, at least one of ethylenediamine, propylenediamine, trimethylenediamine, triethylenediamine, methylpentanediamine, tetramethylenediamine, 1,3-diaminobutane, 2,3-diaminobutane, pentamethylenediamine, 2,4-diaminopentane, hexamethylenediamine, heptamethylenediamine, octamethylenediamine, nonamethylenediamine, 1,2,3-triaminopropane, hydrazine, tetra(aminomethyl)methane, or any combination thereof. In some embodiments, the polyamine compound comprises, consists of, consists essentially of, or is selected from the group consisting of, at least one of N-methylethylenediamine, N,N-dimethylethylenediamine, trimethylethylenediamine, N-ethylethylenediamine, N,N-diethylethylenediamine, triethylethylenediamine, or any combination thereof. In some embodiments, the polyamine compound comprises, consists of, consists essentially of, or is selected from the group consisting of, at least one of tris(2-aminoethyl)amine, diethylenetriamine, triethylenetetramine, tetraethylenepentamine, heptaethyleneoctamine, nonaethylenedecamine, N',N'-bis(2-aminoethyl)ethane-1,2-diamine, or any combination thereof. In some embodiments, the polyamine compound comprises at least one of 1,2-ethane diamine; 1,2-propane diamine; 1,3-propane diamine; 1,4-butane diamine; 1,6-hexane diamine; 2-methyl-1,5-pentane diamine; 2,2(4),4-trimethylhexanediamine; 2,2,4-trimethyl-1,6-hexanediamine; 2,4,4-trimethyl-1,6-hexanediamine; or any combination thereof.

The silyl halide compound may comprise, consist of, or consist essentially of a compound of formula:

where:

X is a halogen (e.g., F, Cl, Br, or I); and

$R^1$, $R^2$, and $R^3$ each independently comprise a hydrogen, a $C_1$-$C_{10}$ linear alkyl, a $C_3$-$C_{10}$ branched alkyl, a $C_3$-$C_8$ cycloalkyl, an aryl, or a benzyl.

In some embodiments, the silylhalide compound comprises, consists of, consists essentially of, or is selected from the group consisting of, at least one of a dialkylsilylhalide, a trialkylsilylhalide, a monoalkyldiarylsilylhalide, a triarylsilylhalide, or any combination thereof. In some embodiments, the silylhalide compound comprises, consists of, consists essentially of, or is selected from the group consisting of, at least one of dichlorosilane, trichlorosilane, triethylsilylchloride, tert-butyldimethylsilyl chloride, trimethylsilane, trimethylchlorosilane, tetramethylsilylchloride, triphenylsilylchloride, tert-butyldiphenylsilylchloride, or any combination thereof.

The base may comprise a compound capable of deprotonating an amine of the amine compound and displacing a halogen of the silylhalide compound. For example, the base may comprise, consist of, or consist essentially of a nonnucleophilic organic amine. In some embodiments, the base comprises, consists of, or consists essentially of, or is selected from the group consisting of, at least one of trimethylamine; triethylamine; diisopropylethylamine; pyrrolidine; tetramethylguanidine; 1,4-diazabicyclo[2.2.2]octane (DABCO); 1,5-dizabicyclo[4.3.0]non-5-ene (DBN) (CAS No. 3001-72-7); 4-dimethylaminopyridine (DMAP) (CAS No. 1122-58-3); 1,5,7-triazabicyclo[4.4.0]dec-5-ene (TBD) (CAS No. 5807-14-7); 1,8-diazabicyclo[5.4.0]undec-7-ene (DBU) (CAS No. 6674-22-2), or any combination thereof.

The solvent may comprise a polar aprotic solvent which does not participate in or otherwise interfere with the reaction. The solvent may comprise, consist of, or consist essentially of at least one of tetrahydrofuran (THF), diethylether (Et$_2$O), toluene, dichloromethane (CH$_2$Cl$_2$), n-hexane, ethyl acetate (EtOAc), or any combination thereof.

In some embodiments, the silicon precursor is prepared according to the following reaction scheme:

where:

n is 0 to 10;

$R^1$, $R^2$, and $R^3$ each independently comprise a hydrogen, a $C_1$-$C_{10}$ linear alkyl, a $C_3$-$C_{10}$ branched alkyl, a $C_3$-$C_8$ cycloalkyl, an aryl, or a benzyl;

X is F, Cl, Br, or I;

Base comprises at least one of triemethylamine; triethylamine; diisopropylethylamine; pyrrolidine; tetramethylguanidine; 1,4-diazabicyclo[2.2.2]octane (DABCO); 1,5-dizabicyclo[4.3.0]non-5-ene (DBN) (CAS No. 3001-72-7); 4-dimethylaminopyridine (DMAP) (CAS No. 1122-58-3); 1,5,7-triazabicyclo[4.4.0]dec-5-ene (TBD) (CAS No. 5807-14-7); 1,8-diazabicyclo[5.4.0]undec-7-ene (DBU) (CAS No. 6674-22-2); or any combination thereof;

Solvent comprises at least one of tetrahydrofuran (THF), diethylether (Et$_2$O), toluene, dichloromethane (CH$_2$Cl$_2$), n-hexane, ethyl acetate (EtOAc), or any combination thereof; and rt is room temperature (e.g., ambient temperature, such as, for example, a temperature of 20° C. to 30° C. (e.g., about 25° C.)).

In some embodiments, the silicon precursor is prepared according to the following reaction scheme:

where:

n is 0 to 10;

$R^1$, $R^2$, and $R^3$ each independently comprise a hydrogen, a $C_1$-$C_{10}$ linear alkyl, a $C_3$-$C_{10}$ branched alkyl, a $C_3$-$C_8$ cycloalkyl, an aryl, or a benzyl;

X is F, Cl, Br, or I;

Base comprises at least one of triemethylamine; triethylamine; diisopropylethylamine; pyrrolidine; tetramethylguanidine; 1,4-diazabicyclo[2.2.2]octane (DABCO); 1,5-dizabicyclo[4.3.0]non-5-ene (DBN) (CAS No. 3001-72-7); 4-dimethylaminopyridine (DMAP) (CAS No. 1122-58-3); 1,5,7-triazabicyclo[4.4.0]dec-5-ene (TBD) (CAS No. 5807-14-7); 1,8-diazabicyclo[5.4.0]
undec-7-ene (DBU) (CAS No. 6674-22-2); or any
combination thereof;

Solvent comprises at least one of tetrahydrofuran (THF), diethylether ($Et_2O$), toluene, dichloromethane ($CH_2Cl_2$), n-hexane, ethyl acetate (EtOAc), or any combination thereof; and rt is room temperature (e.g., ambient temperature, such as, for example, a temperature of 20° C. to 30° C. (e.g., about 25° C.)).

Figure 2:
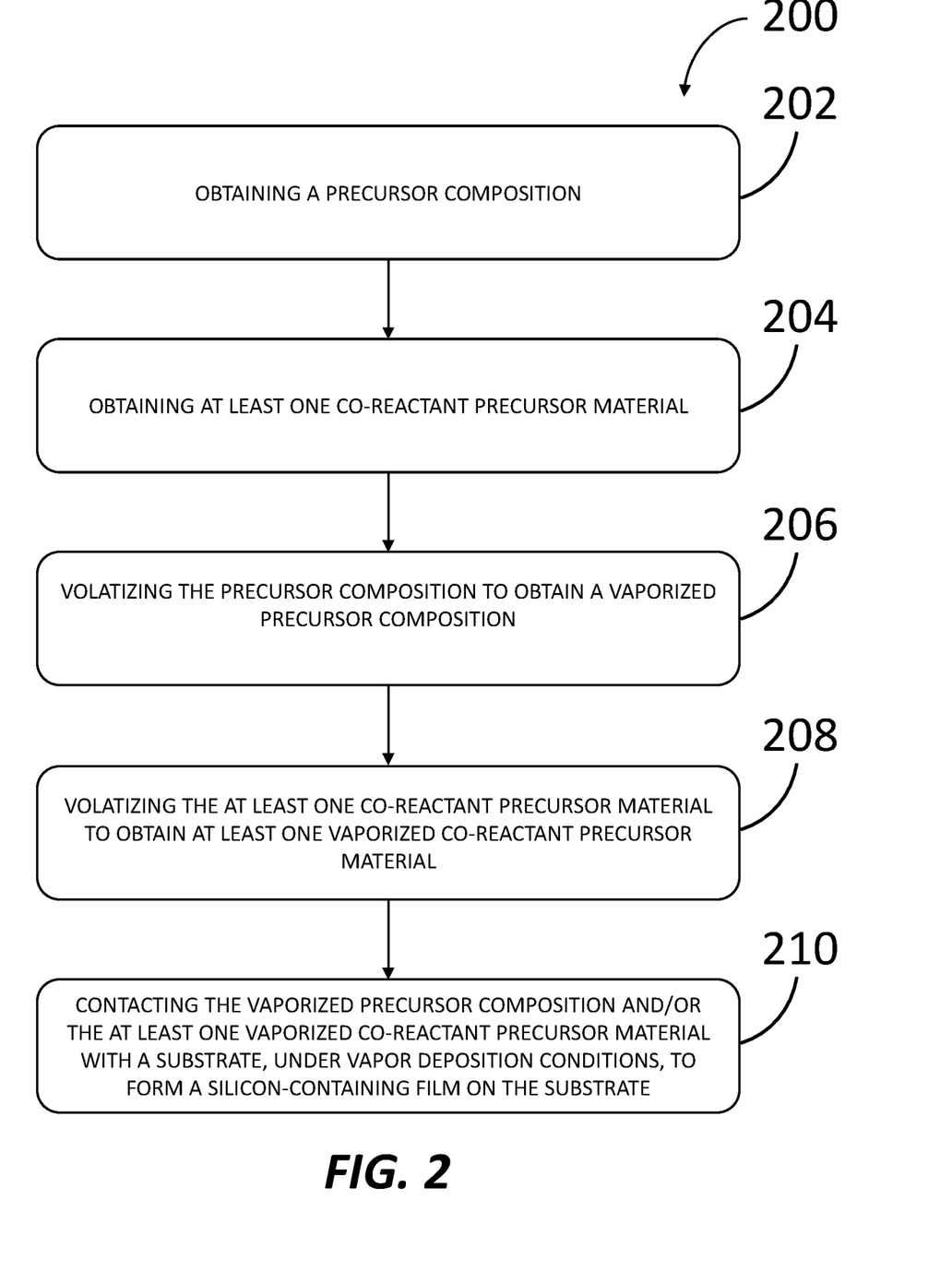
FIG. 2 is a flowchart of a method for making a silicon-containing film, according to some embodiments.

FIG. 2 is a flowchart of a method for making a silicon-containing film, according to some embodiments. As shown in FIG. 2, the method for making a silicon-containing film may comprise, consist of, or consist essentially of one or more of the following steps: obtaining 202 a precursor, obtaining 204 at least one co-reactant precursor, volatizing 206 the precursor to obtain a vaporized precursor, volatizing 208 the at least one co-reactant precursor to obtain at least one vaporized co-reactant precursor, contacting 210 at least one of the vaporized precursor, the at least one vaporized co-reactant precursor, or any combination thereof with a substrate, under vapor deposition conditions, to form a silicon-containing film on the substrate.

The step 202 may comprise, consist of, or consist essentially of obtaining a precursor. The precursor may comprise, consist of, or consist essentially of any one or more of the precursors disclosed herein. The obtaining may comprise obtaining a container or other vessel comprising the precursor. In some embodiments, the precursor may be obtained in a container or other vessel in which the precursor is to be vaporized.

The step 204 may comprise, consist of, or consist essentially of obtaining at least one co-reactant precursor. In some embodiments, the at least one co-reactant precursor comprises, consists of, or consists essentially of, or is selected from the group consisting of, at least one of an oxidizing gas, a reducing gas, a hydrocarbon, or any combination thereof. The at least one co-reactant precursor may be selected to obtain a specific silicon-containing film. In some embodiments, the at least one co-reactant precursor may comprise, consist of, or consist essentially of at least one of $N_2$, $H_2$, $NH_3$, $N_2H_4$, $CH_3HNNH_2$, $CH_3HNNHCH_3$, $NCH_3H_2$, $NCH_3CH_2H_2$, $N(CH_3)_2H_2$, $N(CH_3CH_2)_2H$, $N(CH_3)_3$, $N(CH_3CH_2)_3$, $Si(CH_3)_2NH$, pyrazoline, pyridine, ethylene diamine, a radical thereof, or any combination thereof. In some embodiments, the at least one co-reactant precursor may comprise, consist of, or consist essentially of at least one of $H_2$, $O_2$, $O_3$, $H_2O$, $H_2O_2$, NO, $N_2O$, $NO_2$, CO, $CO_2$, a carboxylic acid, an alcohol, a diol, a radical thereof, or any combination thereof. In some embodiments, the at least one co-reactant precursor comprise, consist of, or consist essentially of at least one of methane, ethane, ethylene, acetylene, or any combination thereof. The obtaining may comprise obtaining a container or other vessel comprising the at least one co-reactant precursor. In some embodiments, the at least one co-reactant precursor may be obtained in a container or other vessel in which the at least one co-reactant precursor is to be vaporized. In some embodiments, the method further comprises an inert gas, such as, for example, at least one of argon, helium, nitrogen, or any combination thereof.

The step 206 may comprise, consist of, or consist essentially of volatizing the precursor to obtain a vaporized precursor. The volatizing may comprise, consist of, or consist essentially of heating the precursor sufficient to obtain the vaporized precursor. In some embodiments, the volatizing may comprise, consist of, or consist essentially of heating a container comprising the precursor. In some embodiments, the volatizing may comprise, consist of, or consist essentially of heating the precursor in a deposition chamber in which the vapor deposition process is performed. In some embodiments, the volatizing may comprise, consist of, or consist essentially of heating a conduit for delivering the precursor, vaporized precursor, or any combination thereof to, for example, a deposition chamber. In some embodiments, the volatizing may comprise, consist of, or consist essentially of operating a vapor delivery system comprising the precursor. In some embodiments, the volatizing may comprise, consist of, or consist essentially of heating to a temperature sufficient to vaporize the precursor to obtain the vaporized precursor. In some embodiments, the volatizing may comprise, consist of, or consist essentially of heating to a temperature below a decomposition temperature of at least one of the precursor, the vaporized precursor, or any combination thereof. In some embodiments, the precursor may be present in a gas phase, in which case the step 206 is optional and not required. For example, the precursor may comprise, consist of, or consist essentially of the vaporized precursor.

The step 208 may comprise, consist of, or consist essentially of volatizing the at least one co-reactant precursor to obtain the at least one vaporized co-reactant precursor. In some embodiments, the volatizing may comprise, consist of, or consist essentially of heating the at least one co-reactant precursor sufficient to obtain the at least one vaporized co-reactant precursor. In some embodiments, the volatizing may comprise, consist of, or consist essentially of heating a container comprising the at least one co-reactant precursor. In some embodiments, the volatizing may comprise, consist of, or consist essentially of heating the at least one co-reactant precursor in a deposition chamber in which the vapor deposition process is performed. In some embodiments, the volatizing may comprise, consist of, or consist essentially of heating a conduit for delivering the at least one co-reactant precursor, the at least one vaporized co-reactant precursor, or any combination thereof to, for example, a deposition chamber. In some embodiments, the volatizing may comprise, consist of, or consist essentially of operating a vapor delivery system comprising the at least one co-reactant precursor. In some embodiments, the volatizing may comprise, consist of, or consist essentially of heating to a temperature sufficient to vaporize the at least one co-reactant precursor to obtain the at least one vaporized co-reactant precursor. In some embodiments, the volatizing may comprise, consist of, or consist essentially of heating to a temperature below a decomposition temperature of at least one of the at least one co-reactant precursor, the at least one vaporized co-reactant precursor, or any combination thereof. In some embodiments, the at least one co-reactant precursor may be present in a gas phase, in which case the step 108 is optional and not required. For example, the at least one co-reactant precursor may comprise, consist of, or consist essentially of the at least one vaporized co-reactant precursor.

The step 210 may comprise, consist of, or consist essentially of contacting the vaporized precursor and the at least one vaporized co-reactant precursor with the substrate, under vapor deposition conditions, sufficient to form a silicon-containing film on a surface of the substrate. The contacting may be performed in any system, apparatus, device, assembly, chamber thereof, or component thereof suitable for vapor deposition processes, including, for example and without limitation, a deposition chamber, among others. The vaporized precursor and the at least one co-reactant precursor may be contacted with the substrate at the same time or at different times. For example, each of the vaporized precursor, the at least one vaporized co-reactant precursor, and the substrate may be present in the deposition chamber at the same time. That is, in some embodiments, the contacting may comprise contemporaneous contacting or simultaneous contacting of the vaporized precursor and the at least one vaporized co-reactant precursor with the substrate. Alternatively, each of the vaporized precursor and the at least one vaporized co-reactant precursor may be present in the deposition chamber at different times. That is, in some embodiments, the contacting may comprise alternate and/or sequential contacting, in one or more cycles, of the vaporized precursor with the substrate and subsequently contacting the at least one vaporized co-reactant precursor with the substrate.

The vapor deposition conditions may comprise, consist of, or consist essentially of a deposition temperature. The deposition temperature may be a temperature less than the thermal decomposition temperature of at least one of the vaporized precursor, the at least one vaporized co-reactant precursor, or any combination thereof. The deposition temperature may be sufficiently high to reduce or avoid condensation of at least one of the vaporized precursor, the at least one vaporized co-reactant precursor, or any combination thereof. In some embodiments, the substrate may be heated to the deposition temperature. In some embodiments, the chamber or other vessel in which the substrate is contacted with the vaporized precursor and the at least one vaporized co-reactant precursor is heated to the deposition temperature. In some embodiments, at least one of the vaporized precursor, the at least one vaporized co-reactant precursor, or any combination thereof may be heated to the deposition temperature.

The deposition temperature may be a temperature of 200° C. to 2500° C. In some embodiments, the deposition temperature may be a temperature of 500° C. to 700° C. For example, in some embodiments, the deposition temperature may be a temperature of 500° C. to 680° C., 500° C. to 660° C., 500° C. to 640° C., 500° C. to 620° C., 500° C. to 600° C., 500° C. to 580° C., 500° C. to 560° C., 500° C. to 540° C., 500° C. to 520° C., 520° C. to 700° C., 540° C. to 700° C., 560° C. to 700° C., 580° C. to 700° C., 600° C. to 700° C., 620° C. to 700° C., 640° C. to 700° C., 660° C. to 700° C., or 680° C. to 700° C. In other embodiments, the deposition temperature may be a temperature of greater than 200° C. to 2500° C., such as, for example and without limitation, a temperature of 400° C. to 2000, 500° C. to 2000° C., 550° C. to 2400° C., 600° C. to 2400° C., 625° C. to 2400° C., 650° C. to 2400° C., 675° C. to 2400° C., 700° C. to 2400° C., 725° C. to 2400° C., 750° C. to 2400° C., 775° C. to 2400° C., 800° C. to 2400° C., 825° C. to 2400° C., 850° C. to 2400° C., 875° C. to 2400° C., 900° C. to 2400° C., 925° C. to 2400° C., 950° C. to 2400° C., 975° C. to 2400° C., 1000° C. to 2400° C., 1025° C. to 2400° C., 1050° C. to 2400° C., 1075° C. to 2400° C., 1100° C. to 2400° C., 1200° C. to 2400° C., 1300° C. to 2400° C., 1400° C. to 2400° C., 1500° C. to 2400° C., 1600° C. to 2400° C., 1700° C. to 2400° C., 1800° C. to 2400° C., 1900° C. to 2400° C., 2000° C. to 2400° C., 2100° C. to 2400° C., 2200° C. to 2400° C., 2300° C. to 2400° C., 500° C. to 2000° C., 500° C. to 1900° C., 500° C. to 1800° C., 500° C. to 1700° C., 500° C. to 1600° C., 500° C. to 1500° C., 500° C. to 1400° C., 500° C. to 1300° C., 500° C. to 1200° C., 500° C. to 1100° C., 500° C. to 1000° C., 500° C. to 1000° C., 500° C. to 900° C., or 500° C. to 800° C.

The vapor deposition conditions may comprise, consist of, or consist essentially of a deposition pressure. In some embodiments, the deposition pressure may comprise, consist of, or consist essentially of a vapor pressure of at least one of the vaporized precursor, the at least one vaporized co-reactant precursor, or any combination thereof. In some embodiments, the deposition pressure may comprise, consist of, or consist essentially of a chamber pressure.

The deposition pressure may be a pressure of 0.001 Torr to 100 Torr. For example, in some embodiments, the deposition pressure may be a pressure of 1 Torr to 30 Torr, 1 Torr to 25 Torr, 1 Torr to 20 Torr, 1 Torr to 15 Torr, 1 Torr to 10 Torr, 5 Torr to 50 Torr, 5 Torr to 40 Torr, 5 Torr to 30 Torr, 5 Torr to 20 Torr, or 5 Torr to 15 Torr. In other embodiments, the deposition pressure may be a pressure of 1 Torr to 100 Torr, 5 Torr to 100 Torr, 10 Torr to 100 Torr, 15 Torr to 100 Torr, 20 Torr to 100 Torr, 25 Torr to 100 Torr, 30 Torr to 100 Torr, 35 Torr to 100 Torr, 40 Torr to 100 Torr, 45 Torr to 100 Torr, 50 Torr to 100 Torr, 55 Torr to 100 Torr, 60 Torr to 100 Torr, 65 Torr to 100 Torr, 70 Torr to 100 Torr, 75 Torr to 100 Torr, 80 Torr to 100 Torr, 85 Torr to 100 Torr, 90 Torr to 100 Torr, 95 Torr to 100 Torr, 1 Torr to 95 Torr, 1 Torr to 90 Torr, 1 Torr to 85 Torr, 1 Torr to 80 Torr, 1 Torr to 75 Torr, or 1 Torr to 70 Torr. In other further embodiments, the deposition pressure may be a pressure of 1 mTorr to 100 mTorr, 1 mTorr to 90 mTorr, 1 mTorr to 80 mTorr, 1 mTorr to 70 mTorr, 1 mTorr to 60 mTorr, 1 mTorr to 50 mTorr, 1 mTorr to 40 mTorr, 1 mTorr to 30 mTorr, 1 mTorr to 20 mTorr, 1 mTorr to 10 mTorr, 100 mTorr to 300 mTorr, 150 mTorr to 300 mTorr, 200 mTorr to 300 mTorr, or 150 mTorr to 250 mTorr, or 150 mTorr to 225 mTorr.

The substrate may comprise, consist of, or consist essentially of at least one of Si, Co, Cu, Al, W, WN, WC, TiN, Mo, MoC, $SiO_2$, W, SiN, WCN, $Al_2O_3$, AlN, $ZrO_2$, $La_2O_3$, TaN, $RuO_2$, $IrO_2$, $Nb_2O_3$, $Y_2O_3$, hafnium oxide, or any combination thereof. In some embodiments, the silicon-containing film may comprise, consist of, or consist essentially of at least one of at least one of silicon, silicon nitride, silicon oxynitride, silicon oxide, silicon dioxide, silicon carbide, silicon carbonitride, silicon oxycarbonitride, carbon-doped silicon nitride, carbon-doped silicon oxide, carbon-doped silicon oxynitride, or any combination thereof. In some embodiments, the substrate may comprise other silicon-based substrates, such as, for example, one or more of polysilicon substrates, metallic substrates, and dielectric substrates.

Some embodiments relate to a silicon-containing film on a surface of a substrate. In some embodiments, the silicon-containing film comprises any film formed according to the methods disclosed herein. In some embodiments, the silicon-containing film comprises any film prepared from the precursors disclosed herein.

Aspects

Various Aspects are described below. It is to be understood that any one or more of the features recited in the following Aspect(s) can be combined with any one or more other Aspect(s).

Aspect 1. A precursor comprises an aliphatic hydrocarbon and at least one disilylamine group, wherein the at least one disilylamine group is attached to the aliphatic hydrocarbon, wherein the at least one disilylamine group does not comprise a silanide group.

Aspect 2. The precursor according to aspect 1, wherein the aliphatic hydrocarbon comprises a $C_1$-$C_{10}$ alkane.

Aspect 3. The precursor according to aspects 1-2, wherein the aliphatic hydrocarbon comprises a linear $C_1$-$C_{10}$ alkane.

Aspect 4. The precursor according to aspects 1-3, wherein the aliphatic hydrocarbon comprises a branched $C_1$-$C_{10}$ alkane.

Aspect 5. The precursor according to aspects 1-4, wherein the at least one disilylamine group has the following chemical formula:

where:
R¹, R², and R³ independently comprise a hydrogen, a $C_1$-$C_{10}$ linear alkyl, a $C_3$-$C_{10}$ branched alkyl, a $C_3$-$C_8$ cycloalkyl, an aryl, or a benzyl.

Aspect 6. The precursor according to aspects 1-5, further comprising at least one silylamine group attached to the aliphatic hydrocarbon.

Aspect 7. The precursor according to aspects 1-6, wherein the at least one silylamine group has the following chemical formula:

where:
R¹, R², and R³ independently comprise a hydrogen, a $C_1$-$C_{10}$ linear alkyl, a $C_3$-$C_{10}$ branched alkyl, a $C_3$-$C_8$ cycloalkyl, an aryl, or a benzyl.

Aspect 8. The precursor according to aspects 1-7, wherein the precursor is a compound of the formula:

or where:
n is 0 to 10; and
R¹, R², and R³ independently comprise a hydrogen, a $C_1$-$C_{10}$ linear alkyl, a $C_3$-$C_{10}$ branched alkyl, a $C_3$-$C_8$ cycloalkyl, an aryl, or a benzyl.

Aspect 9. The precursor according to aspects 1-8, wherein the precursor is a reaction product of a polyamine compound and a silylhalide compound.

Aspect 10. The precursor according to aspects 1-9, wherein the precursor is a compound of the formula:

or

Aspect 11. The precursor according to aspects 1-10, wherein the precursor is a liquid at room temperature.

Aspect 12. A method for forming a silicon-containing film comprising obtaining a precursor comprising an aliphatic hydrocarbon and at least one disilylamine group, wherein the at least one disilylamine group is attached to the aliphatic hydrocarbon, wherein the at least one disilylamine group does not comprise a silanide group; vaporizing the precursor to obtain a vaporized precursor; and contacting the vaporized precursor with a substrate, under vapor deposition conditions, to form a silicon-containing film on the substrate.

Aspect 13. The method according to aspect 12, wherein the vapor deposition conditions include atomic layer deposition conditions.

Aspect 14. The method according to aspects 12-13, wherein the vapor deposition conditions include plasma-enhanced atomic layer deposition conditions.

Aspect 15. The method according to aspects 12-14, wherein the vapor deposition conditions include thermal atomic layer deposition conditions.

Aspect 16. The method according to aspects 12-15, wherein the silicon-containing film comprises at least one of SiO, SiN, SiOC, SiCN, SiOCN, or any combination thereof.

Aspect 17. The method according to aspects 12-16, wherein the precursor is a compound of the formula:

where:
n is 0 to 10; and
R¹, R², and R³ independently comprise a hydrogen, a $C_1$-$C_{10}$ linear alkyl, a $C_3$-$C_{10}$ branched alkyl, a $C_3$-$C_8$ cycloalkyl, an aryl, or a benzyl.

Aspect 18. The method according to aspects 12-17, wherein the precursor is a compound of the formula:

where:
n is 0 to 10; and
$R^1$, $R^2$, and $R^3$ independently comprise a hydrogen, a $C_1$-$C_{10}$ linear alkyl, a $C_3$-$C_{10}$ branched alkyl, a $C_3$-$C_8$ cycloalkyl, an aryl, or a benzyl.

Aspect 19. The method according to aspects 12-18, wherein the precursor is a compound of the formula:

or

Aspect 20. A method for making a precursor comprising reacting a polyamine compound and a silylhalide compound, in a presence of a base, to form a precursor for vapor deposition comprising an aliphatic hydrocarbon and at least one disilylamine group, wherein the at least one disilylamine group is attached to the aliphatic hydrocarbon, wherein the at least one disilylamine group does not comprise a silanide group.

EXAMPLES

Silicon Precursor 1

Figure 3:
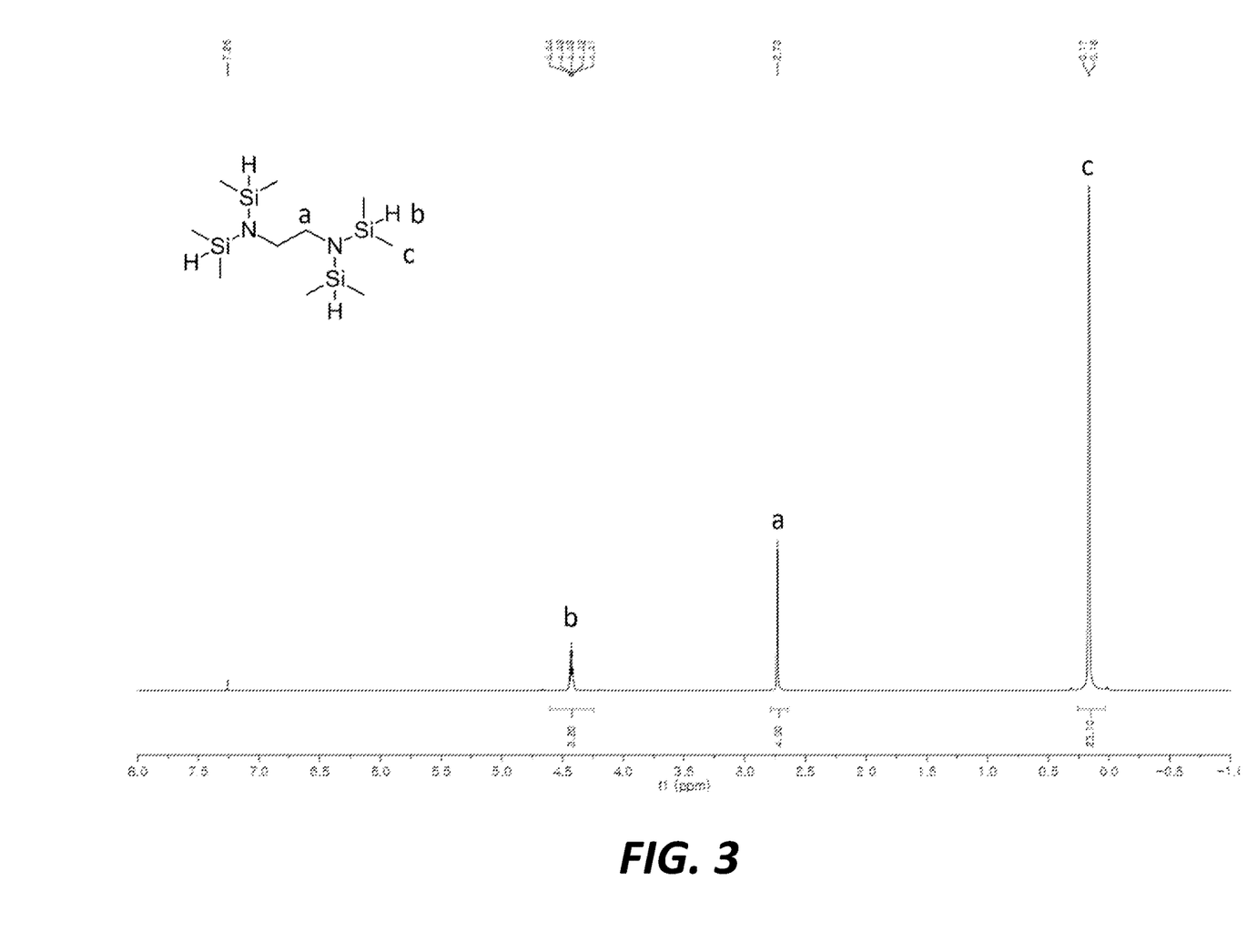
FIG. 3 is a proton nuclear magnetic resonance ($^1$H NMR) spectrum, according to some embodiments.

To prepare the silicon precursor 1 (above), triethylamine (TEA, 276.8 ml, 2.0 mol) and ethylenediamine (33.4 ml, 0.5 mol) were added to a flame dried vessel charged with dichloromethane (1.5 L). Chlorodimethylsilane (CDMS, 217.7 ml, 2.0 mol) was then slowly added in a dropwise manner. The reaction mixture was refluxed to 50° C. for 16 hours under an $N_2$ atmosphere. The reaction produced a white precipitate, which was filtered through a celite pad with n-hexane, thereby quenching the reaction. The filterate was concentrated at 50° C. and 250 torr. Purification by fractional distillation at 80° C. and 1 torr afforded the desired product (118 g, 81% yield) as a colorless liquid. $^1$H NMR (CDCl$_3$): δ 4.44-4.41 (m, 4H), 2.73 (s, 4H), 0.16 (d, J=0.1 Hz, 24H) ppm. See FIG. 3.

What is claimed is:
1. A precursor comprising:
an aliphatic hydrocarbon and at least one disilylamine group,
wherein the at least one disilylamine group is attached to the aliphatic hydrocarbon,
wherein the at least one disilylamine group does not comprise a silanide group,
wherein the precursor is a liquid at room temperature.
2. The precursor of claim 1, wherein the aliphatic hydrocarbon comprises a $C_1$-$C_{10}$ alkane.
3. The precursor of claim 1, wherein the aliphatic hydrocarbon comprises a linear $C_1$-$C_{10}$ alkane.
4. The precursor of claim 1, wherein the aliphatic hydrocarbon comprises a branched $C_1$-$C_{10}$ alkane.
5. The precursor of claim 1, wherein the at least one disilylamine group has the following chemical formula:

where:
$R^1$, $R^2$, and $R^3$ independently comprise a hydrogen, a $C_1$-$C_{10}$ linear alkyl, a $C_3$-$C_{10}$ branched alkyl, a $C_3$-$C_8$ cycloalkyl, an aryl, or a benzyl.
6. The precursor of claim 1, further comprising at least one silylamine group attached to the aliphatic hydrocarbon.
7. The precursor of claim 6, wherein the at least one silylamine group has the following chemical formula:

where:
$R^1$, $R^2$, and $R^3$ independently comprise a hydrogen, a $C_1$-$C_{10}$ linear alkyl, a $C_3$-$C_{10}$ branched alkyl, a $C_3$-$C_8$ cycloalkyl, an aryl, or a benzyl.
8. The precursor of claim 1, wherein the precursor is a compound of the formula:

or where:
n is 0 to 10; and
R¹, R², and R³ independently comprise a hydrogen, a $C_1$-$C_{10}$ linear alkyl, a $C_3$-$C_{10}$ branched alkyl, a $C_3$-$C_8$ cycloalkyl, an aryl, or a benzyl.

9. The precursor of claim 1, wherein the precursor is a reaction product of a polyamine compound and a silylhalide compound.

10. The precursor of claim 1, wherein the precursor is a compound of the formula:

or

11. A precursor comprising:
an aliphatic hydrocarbon comprises a $C_1$-$C_{10}$ alkane and at least one disilylamine group,
wherein the at least one disilylamine group is attached to the aliphatic hydrocarbon,
wherein the at least one disilylamine group does not comprise a silanide group.

12. The precursor of claim 11, wherein the aliphatic hydrocarbon comprises a linear $C_1$-$C_{10}$ alkane.

13. The precursor of claim 11, wherein the aliphatic hydrocarbon comprises a branched $C_1$-$C_{10}$ alkane.

14. A precursor comprising:
an aliphatic hydrocarbon and at least one disilylamine group,
wherein the at least one disilylamine group is attached to the aliphatic hydrocarbon,
wherein the at least one disilylamine group does not comprise a silanide group,
wherein the precursor is a compound of the formula:

or where:
n is 0 to 10; and
R¹, R², and R³ independently comprise a hydrogen, a $C_1$-$C_{10}$ linear alkyl, a $C_3$-$C_{10}$ branched alkyl, a $C_3$-$C_8$ cycloalkyl, an aryl, or a benzyl.

15. The precursor of claim 14, wherein the precursor is a reaction product of a polyamine compound and a silylhalide compound.

16. The precursor of claim 14, wherein the precursor is a compound of the formula:

17. The precursor of claim 14, wherein the precursor is a compound of the formula:

* * * * *